(12) United States Patent
Van Buggenhout

(10) Patent No.: US 10,269,667 B2
(45) Date of Patent: Apr. 23, 2019

(54) SEMICONDUCTOR DEVICE PACKAGING WITH REDUCED SIZE AND DELAMINATION

(71) Applicant: MELEXIS TECHNOLOGIES NV, Tessenderlo (BE)

(72) Inventor: Carl Van Buggenhout, Aalst (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 14/893,139

(22) PCT Filed: May 23, 2014

(86) PCT No.: PCT/EP2014/060747
§ 371 (c)(1),
(2) Date: Nov. 23, 2015

(87) PCT Pub. No.: WO2014/187996
PCT Pub. Date: Nov. 27, 2014

(65) Prior Publication Data
US 2016/0093544 A1    Mar. 31, 2016

(30) Foreign Application Priority Data
May 23, 2013  (GB) .................................. 1309349.7

(51) Int. Cl.
*H01L 23/02* (2006.01)
*H01L 23/04* (2006.01)
(Continued)

(52) U.S. Cl.
CPC ........ *H01L 23/041* (2013.01); *B81C 1/00269* (2013.01); *H01L 21/52* (2013.01);
(Continued)

(58) Field of Classification Search
CPC ... H01L 23/041; H01L 23/3157; H01L 21/56; H01L 21/52; H01L 23/3142; H01L 2224/16; H01L 2924/0002; H01L 33/48; H01L 33/483; H01L 23/04; H01L 23/043; H01L 23/045; H01L 23/047;
(Continued)

(56) References Cited

U.S. PATENT DOCUMENTS 5,804,004 A * 9/1998 Tuckerman ............. H01L 24/78
156/300
6,624,921 B1   9/2003 Glenn et al.
(Continued)

OTHER PUBLICATIONS

International Search Report for corresponding International PCT Application No. PCT/EP2014/060747, dated Oct. 24, 2014.

*Primary Examiner* — Kimberly N Rizkallah
*Assistant Examiner* — Dilinh P Nguyen
(74) *Attorney, Agent, or Firm* — Workman Nydegger

(57) ABSTRACT

A packaged semiconductor device comprising a stack including a die comprising a functional circuit, and a cap which is wafer bonded to the die for protecting the functional circuit as well as a mold component for packaging the stack. At least the cap and/or the die comprises at least one groove at least partially in contact with the mold component, for increasing adhesion of the mold component to the stack. A corresponding method for manufacturing such a packaged device also is described.

6 Claims, 4 Drawing Sheets

(51) Int. Cl.
*B81C 1/00* (2006.01)
*H01L 23/31* (2006.01)
*H01L 21/52* (2006.01)
*H01L 21/56* (2006.01)
*H01L 23/16* (2006.01)

(52) U.S. Cl.
CPC .............. *H01L 21/56* (2013.01); *H01L 23/16* (2013.01); *H01L 23/3142* (2013.01); *H01L 23/3157* (2013.01); *B81C 2203/0118* (2013.01); *H01L 2224/16* (2013.01); *H01L 2924/0002* (2013.01)

(58) Field of Classification Search
CPC ... H01L 23/049; H01L 23/051; H01L 23/053; H01L 23/057; H01L 23/16; B81C 1/00269; B81C 2203/0118
USPC .......................................... 257/680, 730, 787
See application file for complete search history.

(56) References Cited

U.S. PATENT DOCUMENTS

| | | | |
|---|---|---|---|
| 6,818,998 B2 * | 11/2004 | Kwon | H01L 23/3121 257/686 |
| 7,575,953 B2 | 8/2009 | Tan et al. | |
| 2006/0255478 A1 | 11/2006 | Hagen et al. | |
| 2007/0035001 A1 * | 2/2007 | Kuhmann | B81C 1/0023 257/680 |
| 2007/0181990 A1 * | 8/2007 | Huang | H01L 21/561 257/686 |
| 2013/0056844 A1 * | 3/2013 | Oganesian | H01L 27/14618 257/443 |
| 2013/0075881 A1 | 3/2013 | Huang et al. | |
| 2014/0001582 A1 * | 1/2014 | Kuo | H01L 23/49575 257/417 |

\* cited by examiner

SEMICONDUCTOR DEVICE PACKAGING WITH REDUCED SIZE AND DELAMINATION

FIELD OF THE INVENTION

The invention relates to the field of packaged semiconductor devices. More specifically it relates to a packaged chip for a semiconductor device comprising a cap with reduced packaging size, and a method for producing such a packaged chip.

BACKGROUND OF THE INVENTION

Chips for electronic devices, particularly sensors, can be made by stacking a cap on a substrate or wafer. In general, the cap may act as a protective shield for the active element or die. In the particular case of sensors, the cap may have additional uses and features, for instance as thermal insulator or as radiation filter. For particular embodiments of certain sensors, it is advantageous that the cap is comprised of silicon. In several further applications, a cavity is needed in the cap, which is usually etched.

The cap and the active element are fixed together, typically by wafer bonding, for example the cap is fixed to a sensor wafer. The cap adhesion is usually not sufficient, so a mold component is added for packaging purposes. The addition of this mold disadvantageously increases the device size. Despite the mold, the adhesion may still be lacking and delamination may take place, rendering the chip useless.

U.S. Pat. No. 7,575,953 discloses a three-die stack assembly in which one die is shaped for receiving another die, and the third die is shaped so there is room for connections in between the second and third die. This assembly can be fixed by adhesive or mold component, but the connections increase considerably the packaging size. In addition, the assembly is not optimal for certain type of devices, for instance radiation sensors.

SUMMARY OF THE INVENTION

It is an object of embodiments of the present invention to provide a packaged semiconductor device with good reliability, and a method for manufacturing such packaged semiconductor device.

It is an advantage of embodiments of the present invention to provide packaged semiconductor device having a better reliability than at least some packaged semiconductor devices known in the prior art.

It is an advantage of embodiments of the present invention that delamination between mold material filling the space between semiconductor device and package is reduced, or even avoided.

It is an advantage of embodiments of the present invention that a packaged device with reduced package size may be obtained.

The above objective is accomplished by a method and device according to the present invention.

The present invention relates to a packaged semiconductor device comprising a stack comprising a die comprising a functional circuit, a cap being attached to the die for protecting the functional circuit, and a mold component for overmolding the stack except for an access window, wherein at least the cap and/or the die comprises at least one anchoring feature under the form of a groove in the upstanding wall, at least partially in contact with the mold component, for increasing adhesion of the mold component to the stack. The cap may be bonded to the die, e.g. wafer bonded to the die. It is an advantage of embodiments of the present invention that adhesion between mold component and cap is increased with respect the prior art. It is an advantage of embodiments of the present invention that use can be made of the package to produce a System in Package, a Multi-Chip Module, flip chips, sensor arrays or packages of the like.

Both the cap and the die may comprise at least one groove, or any of cap or die may contain a groove, and the other element may contain another type of anchoring feature.

It is an advantage of embodiments of the present invention that by the groove an extended contact surface is formed between the mold component and the cap and/or die.

It is an advantage of embodiments of the present invention that a groove does not significantly affect the strength of the cap.

It is an advantage of embodiments of the present invention that the anchoring feature can be provided at wafer level, wherein part of the protective area and the scribe are obtained without additional cost. If for example the protective area is about 20 µm, part of the scribe is about 30 µm, the scribe having an average size of 90 µm. After sawing the device, it still provides a non-used region, which can be advantageous.

At least one dimension of the at least one groove may be between 50 µm and 150 µm e.g. between 90 µm and 120 µm.

The cap may comprise at least one cavity arranged to face the die. It is an advantage of embodiments of the present invention that a cavity is defined, which is suitable for harboring a functional element, such as for example a MEMS, or for increasing the distance between a surface of the cap and the chip in embodiments in which this is advantageous.

The functional circuit may be a sensor circuit. It is an advantage of embodiments of the present invention that embodiments of the present invention can be used for a variety of sensing devices such as for example optical sensors, pressure sensors, etc.

The cap may be a semiconductor cap. It is an advantage of embodiments of the present invention that the device can be a light sensing device, whereby the cap may be transparent to radiation of a certain range of wavelengths. The semiconductor cap may for example be a silicon or germanium cap, embodiments of the present invention not being limited thereto.

The present invention also relates to a method for obtaining a packaged semiconductor device, the method comprising obtaining a die comprising a functional circuit and a cap, at least one of the die and/or the cap having at least one groove in an upstanding wall, attaching, e.g. bonding, the cap and the die for forming the semiconductor device, and overmolding the semiconductor device except for an access window, thereby bringing the molding component at least partially in contact with the at least one groove for increasing adhesion of the mold component to the semiconductor device.

Obtaining a die and a cap may comprise providing a groove in at least one of the die comprising a functional circuit and/or the cap.

Providing a groove may comprise applying a deep reactive ion etching step for forming the groove as an anchoring feature. It is an advantage of embodiments of the present invention that a high control of the etching process is attained.

Providing a groove may comprise applying a wet etching step for forming the groove as an anchoring feature. It is an advantage of embodiments of the present invention that use can be made of the wet etching technique, well known and widely implemented in processes and allowing fast processing.

The method may furthermore comprise simultaneously forming the groove and a cavity in the wafer cap during the same etching step. It is an advantage of embodiments of the present invention that one or more grooves may be provided without the need for additional separate manufacturing steps.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
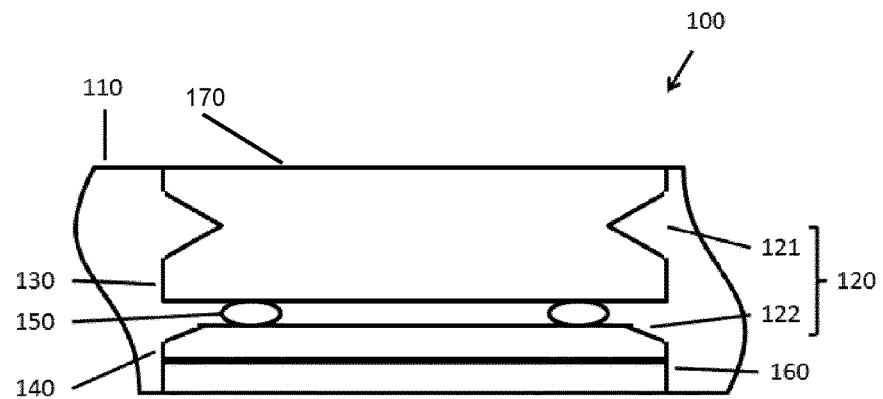
FIG. 1 illustrates a cross-section view of a packaged semiconductor device having anchoring features in a die and wafer cap, according to an embodiment of the present invention.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "die", reference is made to an active element of the device, for instance (but not limited) to a sensor die. In preferred embodiments of the present invention, said die is a silicon die, but it may be any other semiconductor or material.

A die in the context of the present invention is a small block of semiconductor material, on which a given functional circuit may be fabricated. The functional circuit is typically provided on a wafer of semiconductor material, which wafer is then cut into many pieces, each called a die, each die containing one copy of the circuit.

A chip in the context of the present invention is a die comprising the functional electronic circuit. A chip typically is very fragile and therefore is normally surrounded by a tough package, and electrical contacts with the chip are provided through conductive legs sticking out of the package. A semiconductor package in the context of the present invention is a housing containing one or more chips.

Where in embodiments of the present invention reference is made to "cap", reference is made to a substrate for packaging microelectronic elements, suitable for covering the whole or part of a die. In embodiments of the present invention, said cap is a silicon cap. Nevertheless, the cap is a distinct feature of the invention due to its function, regardless of its composition.

In a first aspect, the present invention relates to a packaged semiconductor device. Such a packaged semiconductor device may advantageously be a semiconductor sensing device, although embodiments of the present invention are not limited thereto. By way of illustration, embodiments of the present invention not being limited thereto, an exemplary packaged semiconductor device according to an embodiment of the present invention is further described with reference to FIG. 1 to FIG. 5, illustrating standard and optional features.

The packaged semiconductor device 100 comprises a cap 130 and a die 140. According to embodiments of the present invention, the cap 130 may be partially or fully covering the die 140. The die 140 may be a semiconductor die made using conventional die processing techniques. It may be a silicon die, although embodiments of the present invention are not limited thereto. On the die 140 typically a functional circuit may be provided. Depending on the application envisaged, the functional circuit may be a sensing circuit, such as for example a pressure sensing circuit, an optical circuit, etc.

Figure 2:
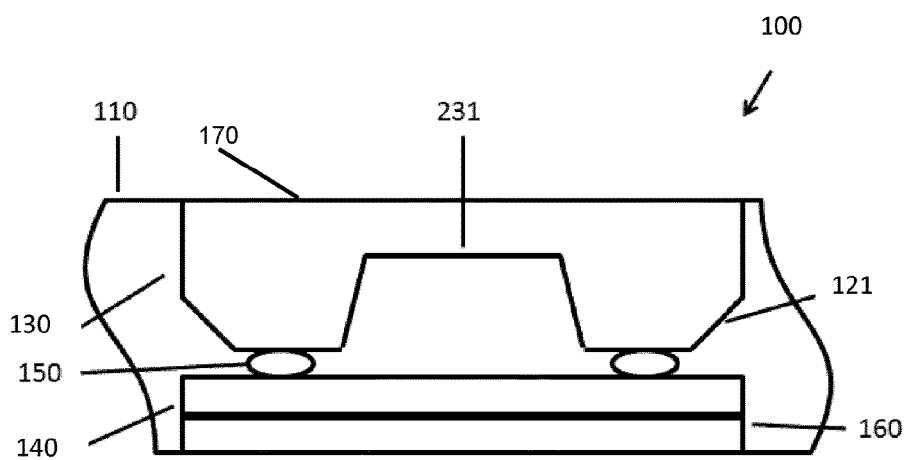
FIG. 2 illustrates a cross-section view of a packaged semiconductor device having an anchoring feature in the wafer cap.

The cap 130, which advantageously can be introduced for protecting the functional circuit on the die, typically may be made of a semiconductor wafer, such as for example a silicon, germanium, . . . wafer. The combination of the die and the cap typically will be referred to as a stack, as both components typically are connected to each other such that the cap is on top of the die. In some embodiments, the cap comprises a cavity 231 to harbor the functional circuit, sometimes also referred to as the active element, as shown in FIG. 2. The cap then may be stacked with the cavity opening facing the active element, thus protecting the functional circuit. Certain embodiments of the present invention may require a cavity to include a sensor, for instance but not limited to a radiation sensor. In some embodiments of the present invention, the cap may act as a shield for radiation noise and thermal isolator, may be provided with a window for providing access to the functional circuit, or still have another function.

According to embodiments of the present invention the die and/or the cap 130 are provided with at least one anchoring feature in the form of a groove in the sidewall, for having good adhesion of a mold component 110 to the device, the mold component 110 used for overmolding the device except for an access window 170. The adhesion typically may be substantially higher than when no anchoring feature(s) is present. The at least one anchoring feature in the form of a groove may be provided in an upstanding wall of the cap 130, the die 140 or in both components. The groove typically may have at least one average dimension, e.g. width or diameter, being in the range 50 µm to 150 µm, for example in the range 90 µm to 120 µm. According to embodiments of the present invention, on top of the at least one anchoring feature in the form of a groove, also other anchoring features such as a protrusion or a recess may be provided. The groove and optionally other anchoring features may be positioned close to the point where the die and the cap are connected to each other, although they also can be positioned further away from this connection point. The groove may be positioned on the upstanding wall of the cap 130. In some embodiments, the at least one groove may extend along the circumference of the die or the cap. The total number of anchoring features may be one, two or more and they may be all positioned on the cap, all positioned on the die or distributed over the cap and the die.

These anchoring features such as grooves may be grinded, machined, etched, carved or in general produced on those surfaces where contact with mold component is expected. In advantageous embodiments, as described below, the at least one anchoring feature in the form of a groove may be produced simultaneously with other features of the electronic device, thus avoiding additional manufacturing complexity.

The at least one anchoring feature, including grooves, typically provides good, e.g. increased, adhesion of a mold component to the device or stack. The mold component 110 typically may be provided for partially or fully covering the die 140 and the cap for protecting these elements or other elements in the electronic device, such as for example bond wires attached thereto. Depending on the properties of the molding material and on the application, part of the device may not be overmoulded, e.g. for introducing a window access 170 to the functional circuit. Not fully overmoulding the electronic device typically has the disadvantage that delamination of the molding material may occur. Embodiments of the present invention counter such delamination by the provision of the at least one groove in an upstanding wall.

The mold component 110 may be any suitable mold material, such as for example an epoxy resin compound or a polymer molding materials, embodiments of the present invention not being limited thereto. Applying the mold component may be performed in any suitable manner, such as for example by pouring mold material over the device, transfer molding, . . . .

The mold may be part of a larger packaging and may fill the space between the semiconductor device and an outside of the packaging.

According to embodiments of the present invention the mold component in the packaged device is positioned such that it is at least partially in contact with the at least one groove in an upstanding wall. In advantageous embodiments, the mold component at least partially, and advantageously completely fills the groove.

According to embodiments of the present invention, other components also may be present in the electronic device. One example thereof is a leadframe 160 to which the die may be connected. Another example of typical features are bonding elements, e.g. bonding material 150, for bonding the cap 130 to the die 140. Such bonding elements 150 may for example be solder bumps, although other types of bonding elements 150 also may be present, such as for example dispensed die attach material, attached die attach film, . . . . Further optional components of the electronic device may be as known by the person skilled in the art and therefore are not discussed in more detail here.

By way of illustration, embodiments of the present invention not being limited thereto, a number of particular embodiments are further discussed below.

In one particular embodiment, the one or more anchoring features all are provided in the cap.

In FIG. 1, the anchoring features 120 shown are a recess 121 being a groove along the circumference of an upstanding wall of the cap. The groove thereby has slanted surfaces. In one example, on top of a groove extending along the circumference, the anchoring feature also may be a recess having a truncated cone shape. Simultaneously, in the present example an anchoring feature 120 also is provided in the die, by forming a slanted surface 122 at the corner of the die, e.g. snipped corners. The outer rim of the die and/or the cap thus may be etched to form an anchoring feature. Although not limited thereto, slanted surfaces typically may be obtained when applying a wet etching process, such etching being one example of a manufacturing technique for such anchoring features.

In another example, as shown in FIG. 2, anchoring features only are provided in the cap. In the present example, the anchoring feature is a slanted surface 121 at the rim of the upstanding wall of the cap 130 again may be manufactured by wet etching, resulting in an anchoring feature with a slanted surface. FIG. 2 furthermore explicitly illustrates the cavity 231 provided in the wafer cap for harboring the functional circuit, e.g. an active element.

Figure 3:
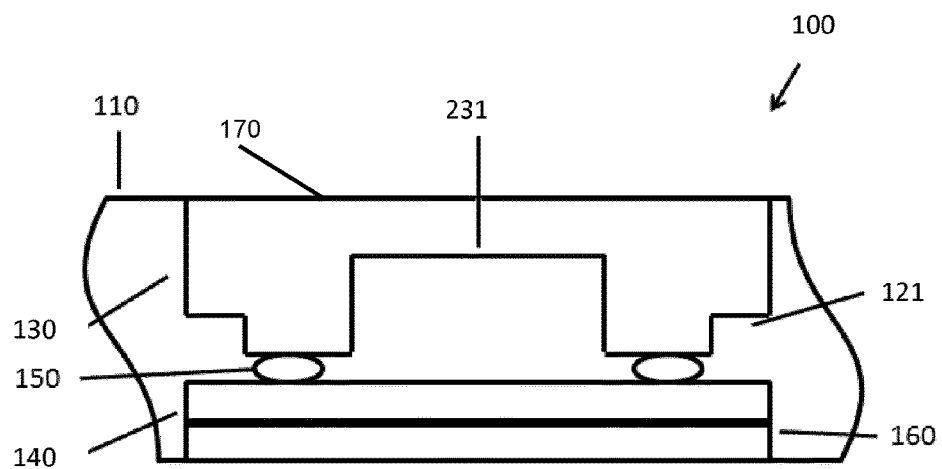
FIG. 3 illustrates a cross-section view of another packaged semiconductor device having an anchoring feature in the wafer cap.

In yet a further example, the anchoring features, for instance but not limited thereto grooves in an upstanding wall, does not have a slanted surface but rather straight walls 121, e.g. parallel to the plane in which the die extends and/or in parallel with an upstanding wall of the wafer cape. Although not limited thereto, such recesses may for example be made by deep reactive ion etching. Such an etching technique may allow good control over the etching process, allowing to provide recesses of a particular shape, such as for example a cylindrical shape. A cross-section of a schematic view of such an electronic device is shown in FIG. 3.

Figure 4:
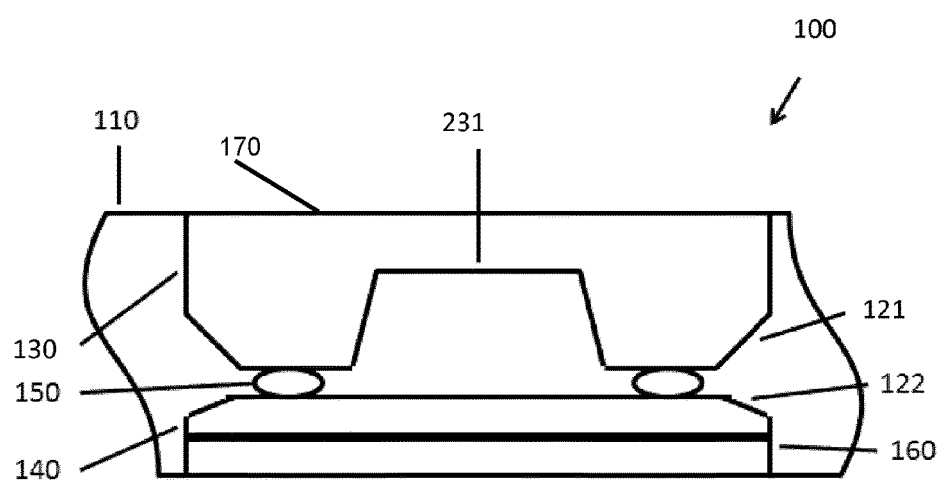
FIG. 4 illustrates a cross-section view of another packaged semiconductor device having anchoring features in both the wafer cap and the die.

Still another particular embodiment, shown in FIG. 4, illustrates the provision of anchoring features 121, 122 both in the die and in the wafer cap, whereby the anchoring features have slanted surfaces and wherein the anchoring feature in the wafer cap is not provided in the middle of the upstanding wall but at an edge thereof. In according to embodiments of the present invention, rather than or on top of the anchoring features illustrated in FIG. 4, grooves may be provided in the die and in the wafer cap. In the example illustrated, when the die and the wafer cap are mounted to each other, the particular anchoring features provide a wedged shaped recess, increasing the contact surface between the mold component and the device.

Figure 5:
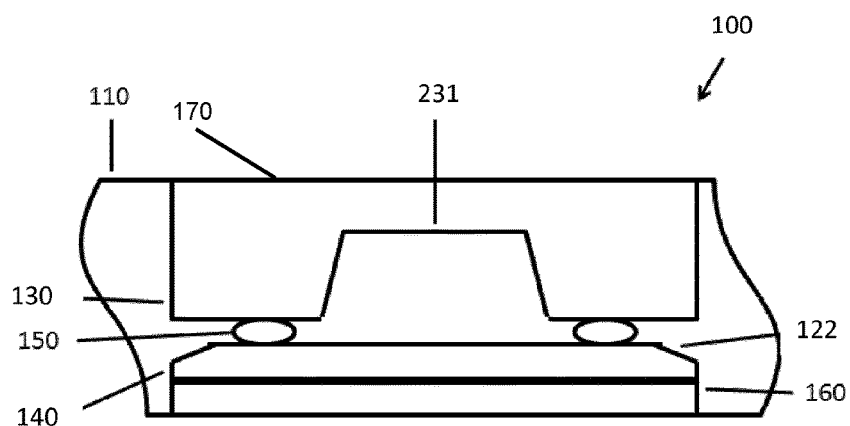
FIG. 5 illustrates a cross-section view of a packaged semiconductor device having anchoring features in the die.

Certain embodiments of the present invention may include only anchoring features 122 in the die and not in the cap, as seen in FIG. 5. The anchoring feature 122 may for instance be provided in the outer rim of the die and may be a recess, or a groove, or a combination of both. The shape of the anchoring feature may be any suitable shape, and depending thereon, different manufacturing techniques may be used for creating such anchoring features.

Figure 6:
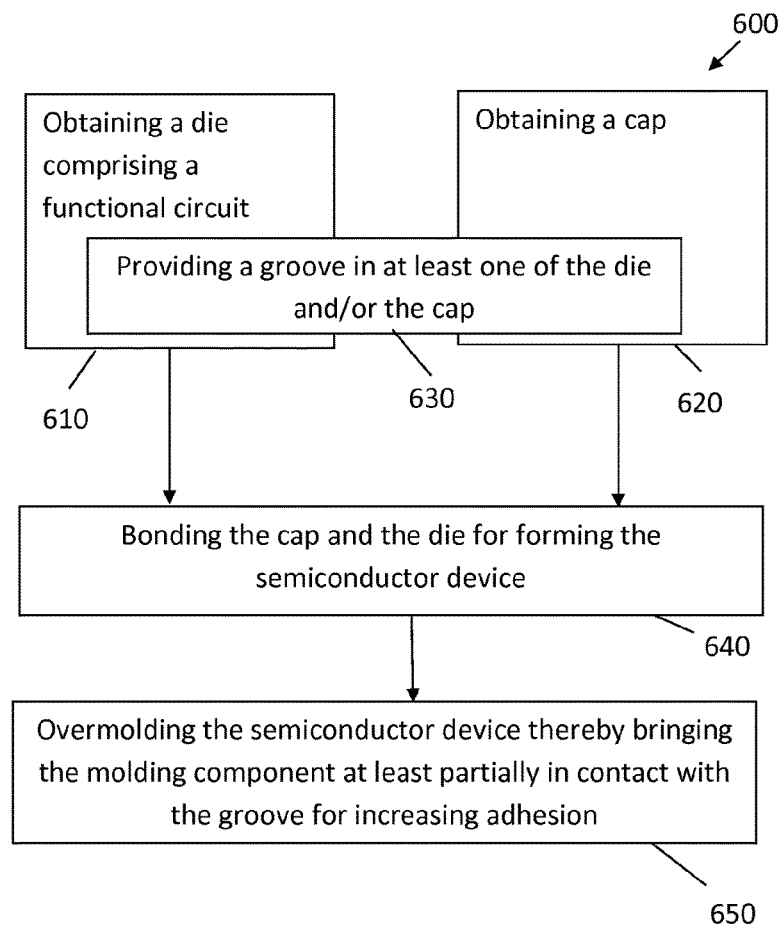
FIG. 6 describes a schematic flow chart of an exemplary method for manufacturing a packaged electronic device according to an embodiment of the present invention.

In a second aspect, the present invention relates a method for manufacturing a packaged semiconductor device. The method may advantageously be used for manufacturing packaged semiconductor devices as described in the first aspect, although embodiments of the present invention are not limited thereto. By way of illustration, an example method 600 is described with reference to FIG. 6, illustrating standard and optional features of embodiments of the present invention.

In the first steps of the production method 600, a die 140 typically comprising a functional circuit and a cap 130 are obtained 610, 620, one of them or both comprising at least one groove 120 in an upstanding wall. Such a groove typically may have at least one average dimension in the range 50 μm to 150 μm. Whereas in some embodiments, obtaining the die 140 and/or the cap 130 may comprise obtaining ready-made components, whereas in other embodiments such obtaining may comprise the manufacturing process of the die 140 and/or the cap 130. The production of a die and/or a cap comprising at least one anchoring feature, including at least one groove and optionally also other anchoring features, may comprise an etching step, although alternative manufacturing steps for the at least one anchoring feature also could be used. Examples of such alternative manufacturing steps may be grinding, laser processing, etc. According to at least some embodiments, the at least one anchoring feature thus may be made by etching. For example, the method may comprise a step of deep reactive-ion etching (DRIE) thus inducing an anchoring feature. This cyclic etching process fundamentally produces a very energetic localized isotropic etching via plasma bombardment, followed by a deposition of a chemical passivation layer, before etching again. The DRIE process ensures a high control of the etching region and etching depth.

The DRIE etching process may result in substantially straight walls of anchoring features, e.g. grooves. The anchoring feature may be introduced in a cap and/or in the die. The cap 130 may also comprise a cavity 231 for covering the die, said cavity 231 produced simultaneously with the anchoring feature 121 via DRIE. The DRIE can be also applied to the die as means to obtain the anchoring features in the die.

In another embodiment of the present invention, alternatively to DRIE, or optionally in addition to DRIE etching, a wet-etching step is provided, for instance anisotropic wet-etching, for producing an anchoring feature. Again, such an anchoring feature may be induced in the cap, in the die or in both. An advantage of the wet etching process may be that it allows fast manufacturing. In the etching step, the etchant used may depend on the type of material the cap or die is made of. In some embodiments an etchant may be used comprising buffered hydrofluoric acid, ethylenediamine pyrocatechol, or any other suitable etchant. Some particular examples may be KOH or TMAH According to some embodiments of the present invention, an etching step performed for manufacturing the at least one groove, which is simultaneously used for processing another part of the die and/or the wafer cap. In one embodiment the etching step may simultaneously introduce the at least one groove and a cavity in the wafer cap.

Simultaneous processing may be obtained by applying a protective mask to the surface of the component etched. For example when at least one anchoring feature including a groove is provided in the cap wafer, the protective mask may be applied so that the mask defines an inner etching zone where the cavity 231 is to be made and an etching zone for etching the anchoring features including the groove in an upstanding wal. The zone where the die and the cap are to be connected to each other typically may be masked to avoid etching at that position, although alternative embodiments also are possible.

The method 600 according to embodiments of the present invention also comprises attaching, e.g. bonding, the cap to the die for forming the semiconductor device. The bonding may in one embodiment be performed using a conventional wafer bonding process. The bonding may be such that the wafer cap is positioned over the functional circuit on the die.

The method according to embodiments of the present invention also comprises overmolding 650 the semiconductor device except for an access window 170, so the mold component 110 is at least partially in contact with the groove and optionally other anchoring features in the die, the cap, or both. In a preferred embodiment of the present invention, the mold component completely fills the groove, hence increasing adhesion of the mold component 110 to the semiconductor device.

The method furthermore may comprise steps expressing the functionality obtained using standard or optional components of a packaged semiconductor device according to a first aspect of the present invention.

The invention claimed is:

1. A packaged semiconductor device comprising
    a stack comprising
        a die comprising a sensor circuit,
        a cap having a top surface and a bottom surface, the cap being attached with its bottom surface to the die for protecting the sensor circuit, and being transparent to a certain range of wavelengths,
        a mold component for overmolding the stack except for an access window, wherein at least the cap comprises at least one groove in an upstanding wall the at least one groove being remote from both the top surface of the cap and the bottom surface of the cap, the at least one groove having slanted surfaces and being at least partially in contact with the mold component, for increasing adhesion of the mold component to the stack.

2. The packaged semiconductor device of claim 1, wherein both the cap and the die comprise at least one groove.

3. The packaged semiconductor device according to claim 1, wherein at least one dimension of the at least one groove is between 50 µm and 150 µm.

4. The packaged semiconductor device according to claim 1, wherein the cap comprises at least one cavity arranged to face the die.

5. The packaged semiconductor device according to claim 1, wherein the cap is a semiconductor cap.

6. A packaged semiconductor device comprising
    a stack comprising
        a die comprising a sensor circuit,
        a cap having a top surface and a bottom surface, the cap being attached with its bottom surface to the die for protecting the sensor circuit, and being transparent to a certain range of wavelengths,
        a mold component for overmolding the stack except for an access window, wherein at least the cap comprises at least one groove in an upstanding wall the at least one groove being remote from both the top surface of the cap and the bottom surface of the cap, the at least one groove having slanted surfaces and being at least partially in direct contact with the mold component, for increasing adhesion of the mold component to the stack.

* * * * *